(12) United States Patent
Mori et al.

(10) Patent No.: US 9,373,939 B2
(45) Date of Patent: Jun. 21, 2016

(54) METHOD FOR MANUFACTURING SEMICONDUCTOR DEVICE AND THE SEMICONDUCTOR DEVICE

(71) Applicant: SUMITOMO ELECTRIC INDUSTRIES, LTD., Osaka (JP)

(72) Inventors: Hiroki Mori, Yokohama (JP); Toshiyuki Tanahashi, Atsugi (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/732,006

(22) Filed: Jun. 5, 2015

(65) Prior Publication Data
US 2015/0357793 A1 Dec. 10, 2015

(30) Foreign Application Priority Data
Jun. 10, 2014 (JP) .................................. 2014-119744

(51) Int. Cl.
| | |
|---|---|
| *H01S 5/00* | (2006.01) |
| *H01S 5/227* | (2006.01) |
| *H01S 5/223* | (2006.01) |
| *H01S 5/32* | (2006.01) |
| *H01S 5/12* | (2006.01) |
| *H01S 5/22* | (2006.01) |
| *H01S 5/323* | (2006.01) |
| *H01S 5/34* | (2006.01) |

(52) U.S. Cl.
CPC ............... *H01S 5/2275* (2013.01); *H01S 5/223* (2013.01); *H01S 5/227* (2013.01); *H01S 5/2224* (2013.01); *H01S 5/2272* (2013.01); *H01S 5/3202* (2013.01); *H01S 5/12* (2013.01); *H01S 5/2201* (2013.01); *H01S 5/3235* (2013.01); *H01S 5/3401* (2013.01); *H01S 2304/04* (2013.01)

(58) Field of Classification Search
CPC ..... H01S 5/2275; H01S 5/2272; H01S 5/227; H01S 5/223; H01S 5/2224; H01S 5/3202; H01S 5/3235; H01S 5/2201; H01S 5/3401; H01S 5/12; H01S 2304/04
See application file for complete search history.

(56) References Cited

U.S. PATENT DOCUMENTS

| | | | | |
|---|---|---|---|---|
| 5,783,844 A | * | 7/1998 | Kobayashi | ............. G02B 6/125 257/103 |
| 2002/0127759 A1 | * | 9/2002 | Watanabe | ......... H01L 31/02019 438/47 |

FOREIGN PATENT DOCUMENTS

JP 2010-267674 11/2010

OTHER PUBLICATIONS

T. Takeuchi et al., "Substrate Orientation Dependence of Fe Doping in MOVPE-Grown InP", *Extended Abstracts of the 1993 International Conference on Solid State Devices and Materials*, 1993, pp. 285-287.

*Primary Examiner* — Yuanda Zhang
(74) *Attorney, Agent, or Firm* — Smith, Gambrell & Russell, LLP

(57) ABSTRACT

A method for manufacturing a semiconductor device comprising the steps of: growing a stacked semiconductor layer on a substrate, the stacked semiconductor layer including an active layer and a cladding layer; forming a mesa structure by etching the stacked semiconductor layer, the mesa structure extending in a [011] direction; and forming a buried layer of Fe-doped InP on the side surface of the mesa structure in a reactor of an organo-metallic vapor phase epitaxy apparatus while supplying a hydrogen chloride gas into the reactor. In the step of forming the buried layer, the hydrogen chloride gas is supplied from the beginning of forming the buried layer. The buried layer has a first region and a second region. The first region has a front surface of a (311)B plane. The second region is formed on the front surface. The Fe concentration of the first region is higher than that of the second region.

5 Claims, 7 Drawing Sheets

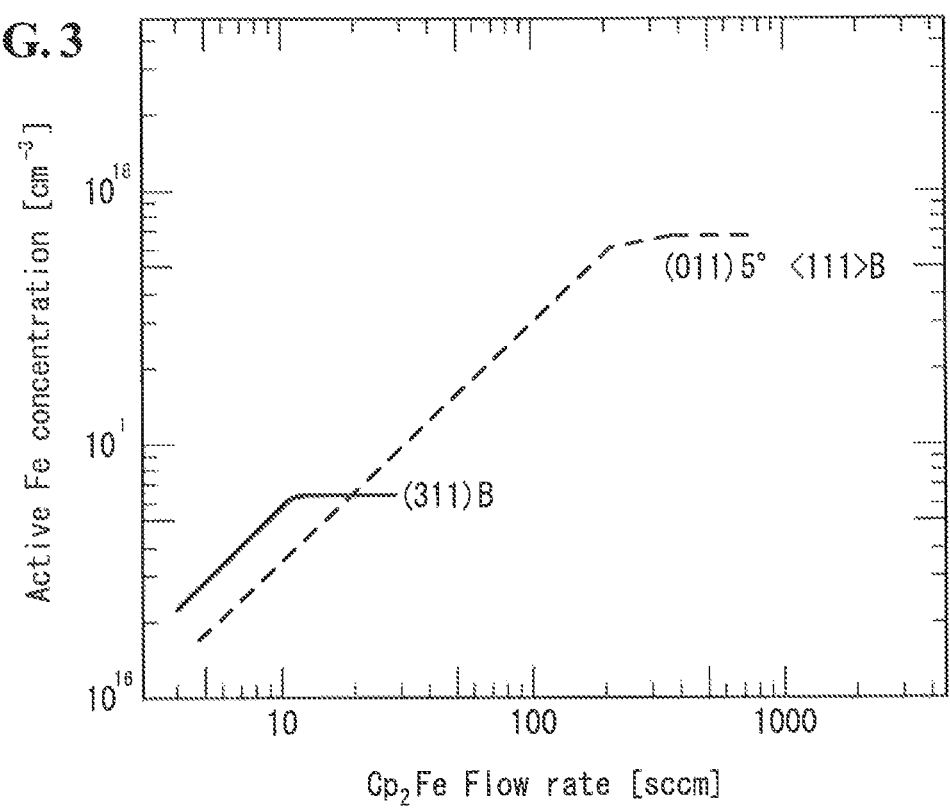

METHOD FOR MANUFACTURING SEMICONDUCTOR DEVICE AND THE SEMICONDUCTOR DEVICE

BACKGROUND OF THE INVENTION

1. Field of the Invention

The present invention relates to a method for manufacturing a semiconductor device and a semiconductor device.

2. Description of the Related Art

Japanese Unexamined Patent Application Publication No. 2010-267674 discloses a method for manufacturing a semiconductor photonic device in which side surfaces of a semiconductor mesa on a substrate are buried in a Fe-doped semiconductor layer. In the method, the Fe-doped semiconductor layer has a first buried layer and a second buried layer. The first buried layer is formed on the semiconductor mesa and the second buried layer is formed on the first buried layer.

In the semiconductor photonic device described in Japanese Unexamined Patent Application Publication No. 2010-267674, the first buried layer is formed by supplying the growing reactor with a raw material gas alone. No halogen-containing gas is supplied for forming the first buried layer. The second buried layer is formed by supplying the growing reactor with a raw material gas and a halogen-containing gas. The halogen-containing gas is effective in leveling the top surface of the second buried layer. However, the supply of a halogen-containing gas during the formation of the first buried layer causes abnormal growth of the first and second buried layers on the mesa.

Tatsuya TAKEUCHI et. al., "Substrate Orientation Dependence of Fe Doping in MOVPE-Grown InP", Extended Abstracts of the 1993 International Conference on Solid State Devices and Materials, 1993; pp. 285-287 discloses a crystal growth method for InP containing Fe. TAKEUCHI et. al. states that Fe in InP includes electrically-active Fe that contributes to the semi-insulating properties of InP (hereinafter referred to as active Fe) and Fe that does not contribute to the semi-insulating properties of InP. The concentration of active Fe depends on the flow rate of an Fe raw material supplied to the growing reactor. In addition, the concentration of active Fe depends also on the crystalline orientation of InP. The concentration of active Fe saturates at a certain flow rate of the Fe raw material, and the saturation concentration of active Fe depends on the crystalline orientation of InP.

SUMMARY OF THE INVENTION

Increasing the concentration of active Fe in a buried layer is desirable to realize the high withstand voltage characteristics of semiconductor photonic devices. However, an excessively high Fe concentration above the saturation concentration results in a degradation of the crystallinity of the burying layer. Degradations of the crystallinity may cause a current leakage in the buried layer, resulting in lowering the withstand voltage. In addition, the abnormal growth in the buried layer also degrades the withstand voltage characteristics. It is important to choose an appropriate Fe concentration in the buried layer avoiding any abnormal growths.

A method for manufacturing a semiconductor device according to the present invention includes the steps of: growing a stacked semiconductor layer on a principal surface of a substrate, the stacked semiconductor layer including an active layer and a cladding layer; forming a mesa structure by etching the stacked semiconductor layer using a dry etching method, the mesa structure extending in a [011] direction; and forming a buried layer on the side surface of the mesa structure and the principal surface of the substrate in a reactor of an organo-metallic vapor phase epitaxy apparatus while supplying a hydrogen chloride gas into the reactor, the buried layer being composed of an Fe-doped InP, wherein in the step of forming the buried layer, the hydrogen chloride gas is supplied from the beginning of forming the buried layer. The buried layer has a first region and a second region. The first is formed on a side surface of the active layer, the first region having a front surface of a (311)B plane. The second region is formed on the front surface of the first region. The first region has a higher Fe concentration than that of the second region. The method provides a semiconductor device that has a buried layer with good crystallinity showing a high withstand voltage.

BRIEF DESCRIPTION OF THE DRAWINGS

FIG. 3 is a graph showing the relationship between the $Cp_2Fe$ flow rate and the active Fe concentration.

DESCRIPTION OF THE PREFERRED EMBODIMENTS

Figure 1A:
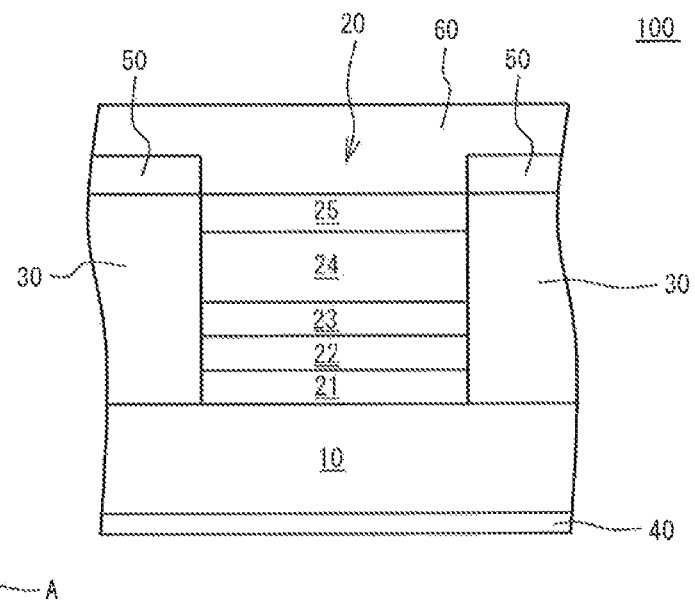
FIG. 1A is a cross-sectional view of a semiconductor device according to an embodiment.

The present invention provides a method for manufacturing a semiconductor device. The method includes the steps of growing a stacked semiconductor layer on a principal surface of a substrate, the stacked semiconductor layer including an active layer and a cladding layer, forming a mesa structure by etching the stacked semiconductor layer using a dry etching method, the mesa structure extending in a [011] direction, and forming a buried layer on the side surface of the mesa structure and the principal surface of the substrate in a reactor of an organo-metallic vapor phase epitaxy apparatus while supplying a hydrogen chloride gas into the reactor, the buried layer being composed of an Fe-doped InP. In the step of forming the buried layer, the hydrogen chloride gas is supplied from the beginning of forming the buried layer. The buried layer has a first region and a second region. The first region is formed on a side surface of the active layer, the first region having a front surface of a (311)B plane. The second region is formed on the front surface of the first region. The first region has a higher Fe concentration than that of the second region.

By the above mentioned method, the first and second regions are formed in the buried layer. The first region and second regions are grown simultaneously using the organo-metallic vapor phase epitaxy (OMVPE) method. The hydrogen chloride gas in the OMVPE reactor has an effect to suppress the growth rate of the first region, resulting in the increase of the concentration of Fe in the first region. In addition, the hydrogen chloride gas has little effect to suppress the growth rate of the second region, resulting in the lower Fe concentration in the second region. Thus, a high withstand voltage owing to the high Fe concentration in the first region and a good crystallinity governed by the moderate Fe concentration in the second region are realized.

According to the above mentioned method, the buried layer is formed at a temperature preferably lower than 620° C. Low growth temperature can prevent the mesa structure from being etched with the hydrogen chloride gas before the mesa structure being covered with the buried layer.

According to the above mentioned method, the buried layer is formed at a temperature preferably ranges from 550° C. to 600° C.

According to the above mentioned method, the hydrogen chloride gas is supplied at a concentration more than 11 ppm.

The above mentioned method for manufacturing a semiconductor device may further include a step of growing a test buried layer on the mesa structure by changing a growth condition of a flow rate of the hydrogen chloride gas; observing a growth rate of the test buried layer in a direction perpendicular to the side surface of the mesa structure; and obtaining a correlation between the growth rate and the flow rate of the hydrogen chloride gas. The steps of forming the test buried layer and observing the growth rate of the test buried layer are performed in advance with the step of forming the buried layer. The buried layer is grown at a condition determined based on the correlation between the growth rate and the flow rate of the hydrogen chloride gas.

The present invention provides a semiconductor device that includes a substrate; a waveguide mesa disposed on the substrate, the waveguide mesa including an active layer and a cladding layer stacked in that order on the substrate, the waveguide mesa extending in a [011] direction; and a buried layer disposed on a side surface of the waveguide mesa. The buried layer is composed of Fe-doped InP. The buried layer includes a first region and a second region. The first region having a front surface of a (311)B plane. The first region is in contact with a side surface of the active layer. The second region is disposed on the first region. The first region has a higher concentration of Fe than that of the second region.

According to the above mentioned semiconductor device, the first region of the buried layer contains the high concentration of Fe. The first region covers the side surface of the active layer which is the most important portion for the high withstand voltage. Thus, the device has an improved withstand voltage. In addition, the Fe concentration in the second region which occupies large part of the buried layer is kept lower than the saturation concentration. Thus, the buried layer has no abnormal growth and keeps a good crystallinity.

According to the above mentioned semiconductor device, the first region preferably has a 10% or more higher concentration of Fe than that of the second region.

According to the above mentioned semiconductor device, the substrate may be composed of n-type InP, the cladding layer may be composed of n-type InP, and the active layer may be composed of GaInAs/AlInAs multi-layer structure. These materials are suitable for Quantum Cascaded Laser (QCL) which needs to have high withstand voltage.

According to the above mentioned semiconductor device, the waveguide mesa may have a height larger than 5 μm, and the active layer may have a thickness larger than 1 μm.

A semiconductor device and a method for manufacturing the semiconductor device according to an embodiment of the present invention will be described below with reference to the accompanying drawings. The present invention is defined by the appended claims rather than by these embodiments. All modifications that fall within the scope of the claims and the equivalents thereof are intended to be embraced by the claims.

FIG. 1A is a cross-sectional view of a semiconductor device 100 according to an embodiment. As illustrated in FIG. 1A, the semiconductor device 100 includes a waveguide mesa 20 on a principal surface of a semiconductor substrate 10. Both sides of the mesa 20 are covered with a buried layer 30. A back electrode 40 is disposed on the back surface of the substrate 10. An insulating film 50 is disposed on the buried layer 30 such that the top surface of the mesa 20 is exposed. An upper electrode 60 is disposed on the top surface of the mesa 20 and the top surface of the insulating film 50. The semiconductor device 100 can be used as a semiconductor laser, for example. In the present embodiment, a quantum cascade laser (QCL) will be described below.

The substrate 10 may be a n-type InP substrate composed of a III-V group compound semiconductor having a zinc blende type crystal structure. The principal surface of the substrate 10 is a (100) crystalline plane. In the present embodiment, the crystal axis and crystal orientation notations include their crystallographic equivalents. If necessary, the principal surface may have an off-cut angle with respect to the (100) plane.

The mesa 20 is disposed on the principal surface of the substrate 10 and has a stripe shape extending in the direction of the arrow A illustrated in FIG. 1A. The direction of the arrow A is parallel to a [011] crystal axis direction. The side surfaces of the mesa 20 are substantially perpendicular to the substrate 10. The mesa 20 has a (0-11) plane on the side surfaces thereof. The mesa 20 includes a stacked semiconductor layer in which a buffer layer 21, an active layer 22, a grating layer 23, a cladding layer 24, and a contact layer 25 are stacked on the substrate 10 in this order.

The buffer layer 21 is formed of n-type InP and has a thickness of 500 nm. The active layer 22 has a multilayer structure composed of approximately 500 layers of GaInAs/AlInAs and has a thickness of approximately 1.5 μm. The grating layer 23 is formed of InGaAs and has a thickness of approximately 500 nm. The cladding layer 24 is formed of n-type InP and has a thickness of 3 μm. The contact layer 25 is formed of GaInAs and has a thickness of 0.1 μm.

In this embodiment, the mesa 20 has a width in the range of approximately 5 to 20 μm. The mesa 20 has a height in the range of approximately 6 to 7 μm. These ranges of height and length of the mesa 20 are preferable for QCL devices.

The buried layer 30 is formed of Fe-doped InP. The back electrode 40 is formed of AuGeNi/Au. The insulating film 50 is formed of silicon dioxide or silicon nitride. The upper electrode 60 is composed of three layers of Ti/Pt/Au.

Figure 1B:
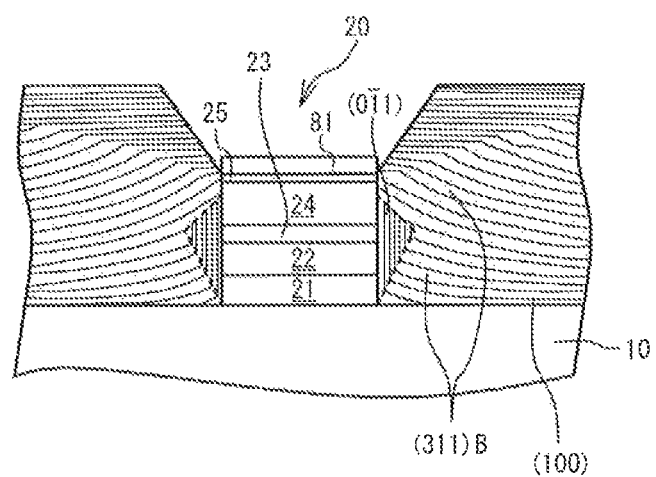
FIG. 1B is a cross-sectional view of a test buried layers.

FIG. 1B shows a cross-section of a test buried layer. The test buried layer is grown on the mesa 20 and on the substrate 10. The test buried layer is used to observe the growth rate and the growth direction under a growth condition. The marker layers, illustrated as streak lines in FIG. 1B, are inserted in the test buried layer. Marker layers are thin and different material from the buried layer. Marker layers are inserted in the epitaxial growth of the test buried layer at regular time intervals in the epitaxial growth. Thus, the growth rate of the test buried layer can be estimated from the distance between the marker layers.

As illustrated in FIG. 1B, the test buried layer has a first region (0-11) and a second region (311)B. The cross-section of the first region (0-11) has a triangular shape. The first region (0-11) comes in contact with the side surface of the mesa 20. A base of the triangular shape of the first region (0-11) comes in contact with the side surface of the active layer 22. The base also comes in contact with the side surfaces of the buffer layer 21, the grating layer 23, and the cladding layer 24 which sandwich the active layer 22. An upper side of the triangular shape of the first region (0-11) is parallel to a (311)B plane. In other words, the first region (0-11) has a front surface of a (311)B plane.

The second region (311)B comes in contact with the two sides of the triangle of the first region (0-11), and surrounds the first region (0-11). The second region (311)B is formed on the front face of the first region (0-11). In a region of the test buried layer apart from the mesa 20, the second region (311)B covers the principal surface of the substrate 10.

As shown in FIG. 1B, streak lines of marker layers in the first region (0-11) are parallel to the (0-11) plane. This means that the buried layer grows in a direction perpendicular to the (0-11) plane in the first region. In the second region (311)B, most of the streak lines are parallel to the (311)B plane near the first region (0-11). In the second region (311)B apart from the mesa 20, the streak lines become nearly parallel to the (100) plane. These mean that, in the second region, the buried layer grows in a direction perpendicular to the (311)B plane near the first region, and grows in a direction perpendicular to the (100) plane near the principal surface of the substrate apart from the mesa 20. In the cross section in FIG. 1B, the (311)B plane forms an angle of approximately 25 degrees with the (100) plane.

The mesa 20 has the (0-11) plane on the both side surfaces thereof. The side surface of the active layer 22 is included in the side surface of the mesa 20. Thus, the side surface of the active layer 22 is formed of (0-11) plane.

In the cross-section in FIG. 1B, the first region (0-11) forms a triangle shape surrounded by the second region (311)B and the side surface of the mesa 20. The first region (0-11) and the second region (311)B extend in the direction of the arrow A in FIG. 1A along the mesa 20.

In the present embodiment, the first region (0-11) has a higher Fe concentration than that in the second region (311)B. More specifically, the first region (0-11) has a higher active Fe concentration than the second region (311)B. The term "active Fe concentration", as used herein, refers to the concentration of electrically-active Fe that contributes to the semi-insulating properties of InP out of the Fe used to dope InP. As described by TAKEUCHI et. al., the active Fe concentration can be measured as the concentration of n-type impurity compensated for by Fe in InP which is co-doped with Fe and the n-type impurity. The concentration of Fe in InP has a saturation concentration. Excessive Fe dopant above the saturation concentration does not contribute to the semi-insulating properties of InP. Excessive Fe doping above the saturation concentration decreases the crystallinity of InP.

Preferably, the first region (0-11) has a 10% or more higher active Fe concentration than the second region (311)B. The "10% or more" in this context means that when the active Fe concentration of the second region (311)B is 100%, the active Fe concentration of the first region (0-11) is 110% or more. Thus, the first region (0-11) in contact with a side surface of the active layer 22 in the burying layer 30 has a relatively high active Fe concentration. High active Fe concentration improves withstand voltage characteristics of the device. In the second region (311)B, a relatively low active Fe concentration suppresses a decrease in the crystallinity of the buried layer 30. Thus, in accordance with the present embodiment, it is possible to suppress a decrease in the crystallinity of the buried layer 30 and to improve withstand voltage characteristics of the device 100.

Figure 2A:
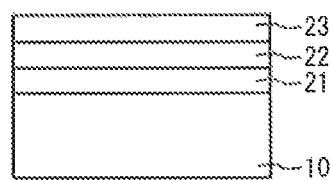
FIGS. 2A to 2E are cross-sectional views illustrating a process for forming a waveguide mesa and a buried layer on a semiconductor substrate.
Figure 2E:
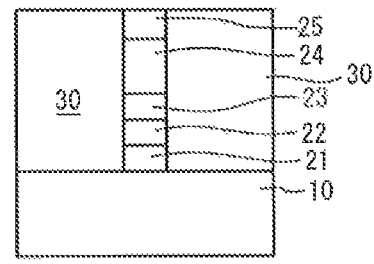

A method for manufacturing the semiconductor device 100 will be described below. FIGS. 2A to 2E are cross-sectional views illustrating a process for forming the mesa 20 and the buried layer 30 on the semiconductor substrate 10. FIGS. 2F to 2H are cross-sectional views illustrating a process for manufacturing a semiconductor device. As illustrated in FIG. 2A, the buffer layer 21, the active layer 22, and the grating layer 23 are formed on the substrate 10 in this order. These layers are parts of a stacked semiconductor layer. These layers are formed by an organo-metallic vapor phase epitaxy (OMVPE) method. The substrate 10 is placed in a reactor of an OMVPE apparatus. The reactor is evacuated to a pressure of approximately 8000 Pa (80 mbar). The reactor is then supplied with a $PH_3$ gas to generate a $PH_3$ atmosphere. The temperature of the reactor is increased to 670° C.

The substrate 10 is formed of n-type InP doped with Si. The buffer layer 21 is grown on the substrate 10 by supplying the reactor with In and P raw material gases and a Si dopant raw material gas. The growth rate of the buffer layer 21 is 2.0 μm/h. The concentration of the n-type dopant in the buffer layer 21 is $1 \times 10^{17}$ $cm^3$. The buffer layer 21 has a thickness of 500 nm. The reactor is then heated to 715° C., and the active layer 22 is grown on the buffer layer 21. The active layer 22 has a multilayer structure composed of GaInAs/AlInAs (approximately 500 layers in total) and has a thickness of 1.5 μm. The grating layer 23 is then grown on the active layer 22. The grating layer 23 is formed of InGaAs and has a thickness of 500 nm. After the grating layer 23 is grown, the substrate 10 is taken out from the reactor.

Figure 2B:
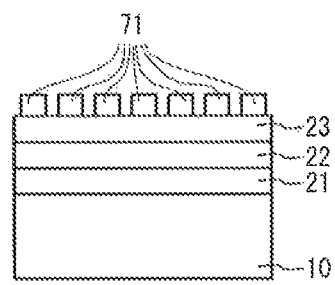

As illustrated in FIG. 2B, silicon nitride masks 71 are formed on the grating layer 23 at regular intervals. FIG. 2B shows FIG. 2A rotated through 90 degrees. Thus, the masks 71 are arranged at regular intervals in the extending direction of the mesa 20 to be formed in the subsequent process. The intervals of the masks 71 may range from approximately 0.2 to 1 μm. The exposed portion of the grating layer 23 is then etched through the masks 71. Thus, a diffraction grating is formed on the grating layer 23. The masks 71 are then removed.

Figure 2C:
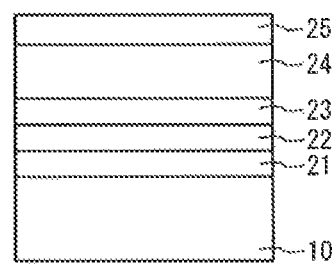

The substrate 10 is placed in the OMVPE reactor again and is heated to 670° C. in a $PH_3$ atmosphere. FIG. 2C is a cross-sectional view viewed in the same direction as FIG. 2A. As illustrated in FIG. 2C, the cladding layer 24 is formed on the grating layer 23 and the contact layer 25 is formed on the cladding layer 24 continuously. The cladding layer 24 is formed of n-type InP and has a thickness of 3 μm. The cladding layer 24 is grown at a growth rate of 2.0 μm/h by supplying the reactor with In and P raw material gases and a Si dopant raw material gas. The concentration of the n-type dopant in the cladding layer 24 ranges from $2 \times 10^{17}$ to $8 \times 10^{18}$/$cm^3$. The contact layer 25 is formed of GaInAs and has a thickness of 0.1 μm. The contact layer 25 is grown at a growth rate of 2.0 μm/h. The concentration of the n-type dopant in the contact layer 25 is $1 \times 10^{19}$/$cm^3$. After these layers are grown, the substrate 10 is cooled to room temperature in a $PH_3$ atmosphere and is taken out from the reactor. The cladding layer 24 and the contact layer 25 are parts of a stack of semiconductor layers.

Figure 2D:
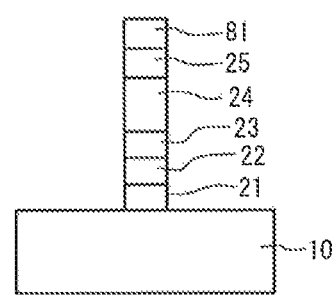
Figure 2F:
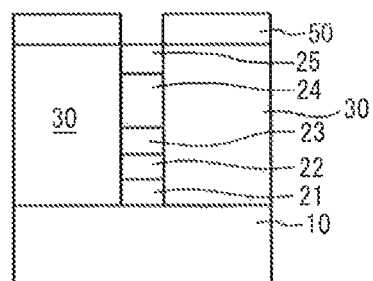
FIGS. 2F to 2H are cross-sectional views illustrating a semiconductor device manufacturing process.
Figure 2G:
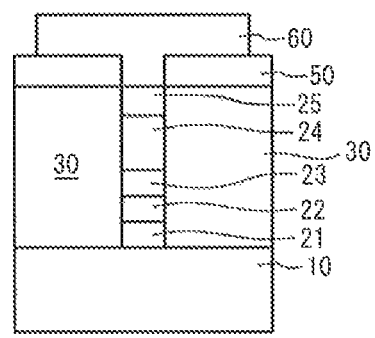
Figure 2H:
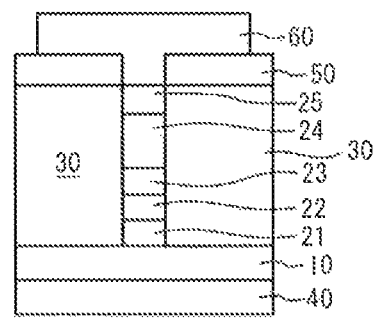

A mask 81 formed of silicon nitride is formed on a region in which the mesa 20 is to be formed. As illustrated in FIG. 2D, the stack of semiconductor layers is dry-etched using the mask 81 by a reactive ion etching (RIE) method. Thus, the mesa 20 having a stripe shape in the [011] direction is formed on the substrate 10. The mesa 20 has a width in the range of approximately 5 to 20 μm. The mesa 20 has a height in the range of approximately 6.0 to 7.0 μm. The side surfaces of the mesa 20 are substantially perpendicular to the principal surface of the substrate 10. The side surfaces of the active layer 22 are appeared on the side surfaces of the mesa 20. The side surfaces of the mesa 20 are substantially parallel to the (0-11) plane. The mesa 20 is then wet-etched with an etchant containing hydrochloric acid and acetic acid. A damaged layer possibly formed on the side surfaces of the mesa 20 in the dry etching process is removed by the wet etching.

Next, as illustrated in FIG. 2E, a step of forming a buried layer is performed. In the step, the buried layer 30 is epitaxially grown on both side surfaces of the mesa 20 and on the substrate 10. The buried layer 30 is formed of InP containing Fe as a dopant. The buried layer 30 illustrated in FIG. 2E is grown as described below.

The substrate 10 having the mesa 20 thereon is placed in a reactor of an OMVPE apparatus. As illustrated in FIG. 2D, the mask 81 used in the dry-etching is remained on the mesa 20. The reactor is heated to 575° C. The reactor is then supplied with In and P raw material gases, an Fe raw material gas of ferrocene ($Cp_2Fe$), a diluent gas of hydrogen ($H_2$), and hydrogen chloride (HCl) gas. These gases are supplied almost simultaneously. The epitaxial growth of the buried layer 30 starts with the supply of the gases.

For epitaxial growth of the buried layer 30, the temperature of the reactor is set to 575° C., the internal pressure of the reactor is set to 10000 Pa (100 mbar). The flow rate of In raw material gas (i.e. III group raw material gas) is 6.63 sccm. The flow rate of $Cp_2Fe$ is 10 sccm. HCl gas is supplied to the reactor at a concentration of 11 ppm. In other words, HCl gas is supplied to the reactor at a HCl ratio to III group of 0.0444. Here, the concentration of HCl is defined as the flow rate of HCl gas devided by the sum of flow rates of all gases supplied to the reactor. The "all gases supplied to the reactor" is composed of In and P raw material gases, HCl gas, $Cp_2Fe$ gas, and $H_2$ gas. The HCl ratio to III group is defined as the ratio of the flow rate of HCl gas to the flow rate of In raw material gas. Under these growth conditions, the buried layer 30 is epitaxially grown on both sides of the mesa 20 and on the surface of the substrate 10. HCl gas is supplied from the beginning of the growth of the buried layer. The flow rate of HCl gas and other gases are kept constant. Thus, the HCl concentration is constant during the epitaxial growth of the buried layer 30. Under these conditions, the growth rate of Fe-doped InP on the (100) plane is 2 μm/h. After the epitaxial growth, the substrate 10 is cooled to room temperature in a $PH_3$ atmosphere and is removed from the reactor.

The first region (0-11) and the second region (311)B grows simultaneously in the step of forming the buried layer 30. By supplying the HCl gas during the growth of the buried layer 30, the growth rate of the first region (0-11) is suppressed. The growth rate is suppressed because an etching of the buried layer by the chloride ions occurs simultaneously with the growth of the buried layer. The chloride ions come from the HCl gas decomposed in the reactor. In addition, HCl gas has little effect to suppress the growth rate of the second region (311)B.

The suppression of the growth rate of the first region (0-11) results in the increase of the concentration of active Fe in the first region (0-11). The suppression of the growth rate of the second region (311)B is not prominent. Thus, the Fe concentration in the second region (311)B does not increase compared to the first region (0-11).

If the temperature of the epitaxial growth of the buried layer 30 is too high, the decomposition of HCl in the reactor is promoted, and the many chloride ions are produced. And if the temperature is high, the chloride ions actively etch the mesa 20. At the very beginning of the growth of the buried layer 30, as the mesa 20 which has not covered with the buried layer 30 is exposed in the atmosphere, chloride ions are easy to etch the mesa 20. Especially, an upper portion of the contact layer 25 in contact with the mask 81 is easier to be etched, in addition to high temperature, a high HCl concentration also results in an increased number of chloride ions, thus promoting the etching of the contact layer 25. Such an irregular etching of the contact layer produces a different crystalline plane from the (0-11) plane on the side surface of the mesa 20. The different crystalline plane has a high growth rate, resulting in an abnormal growth of the buried layer 30. In the present embodiment, by using the conditions (i.e. the temperature, the internal pressure, and the HCl flow rate) described above, abnormal growth does not occur even though the HCl gas is supplied from the beginning of the epitaxial growth.

Next, as illustrated in FIG. 2F, the insulating film 50 is formed on the top surface of the mesa 20 and on the top surface of the buried layer 30. The insulating film 50 is etched so as to the top surface of the mesa 20 is exposed. As illustrated in FIG. 2G, the upper electrode 60 is formed on the top surface of the mesa 20 and on the top surface of the insulating film 50. The back surface of the substrate 10 is shaved to a thickness of approximately 100 μm. Then, as illustrated in FIG. 2H, the back electrode 40 is formed on the back surface of the substrate 10. The substrate 10 is divided into individual chips. Thus, the semiconductor device 100 is completed.

In the present embodiment, the first region has a higher active Fe concentration than that of the second region. The reason and method to change the active Fe concentration in each region of the buried layer will be described below with reference to FIGS. 3 to 6.

FIG. 3 is a graph showing the relationship between the active Fe concentration and the $Cp_2Fe$ flow rate. This figure is adapted from Tatsuya TAKEUCHI et. al., "Substrate Orientation Dependence of Fe Doping in MOVPE-Grown InP". The graph of FIG. 3 was obtained by measuring the active Fe concentration of a Fe-doped InP as a function of the $Cp_2Fe$ flow rate. The Fe-doped InP is grown on a flat substrate having a surface parallel to the (0-11) crystalline plane or on a flat substrate having a surface parallel to the (311)B crystalline plane supplied with $Cp_2Fe$ gas during the growth.

In the graph of FIG. 3, the $Cp_2Fe$ flow rate (sccm) on the horizontal axis is the amount of $Cp_2Fe$ supplied to a reactor per minute. Here, the $Cp_2Fe$ flow rate of FIG. 3 corresponds to a flow rate including $Cp_2Fe$ and a dilute gas. The flow rate of $Cp_2Fe$ excepting for the dilute gas is $5.84 \times 10^{-5}$ sccm when the $Cp_2Fe$ flow rate including the dilute gas is 10 sccm. The active Fe concentrations of Fe-doped InP grown increase with the increase of the $Cp_2Fe$ flow rate. There is a concentration above which the active Fe concentration does not increase with the $Cp_2Fe$ flow rate, that is, an active Fe saturation concentration. FIG. 3 shows that the saturation concentration of the InP grown on the (0-11) plane is higher than that of the InP grown on the (311)B plane. Thus, according to FIG. 3, the Fe-doped InP grown on the (0-11) plane can have a higher active Fe concentration than the Fe-doped InP grown on the (311)B plane by increasing the $Cp_2Fe$ flow rate over 10 sccm.

FIGS. 4A to 4D are cross-sectional views illustrating test buried layers that are grown on the mesa 20 and on the substrate 10 under different growth conditions. The test buried layers are accompanied by marker layers. The cross-sections of the test buried layers are observed using Scanning Electron Microscope (SEM).

The conditions of growing the test buried layers illustrated in FIGS. 4A to 4D are as follows; The HCl concentrations were 0 ppm (the HCl ratio to III group=0) in FIG. 4A, 11 ppm (the HCl ratio to III group=0.0444) in FIG. 4B, 22 ppm (the HCl ratio to III group=0.0887) in FIG. 4C, and 38.4 ppm (the HCl ratio to III group=0.155) in FIG. 4D. Other conditions were common such as, the Cp$_2$Fe flow rate of 10 sccm, the growth temperature of 575° C., and the pressure of the reactor of 10000 Pa (100 mbar). The HCl concentration was changed by changing the flow rate of the HCl gas while keeping the flow rates of other gases constant. The HCl ratio to III group was changed by changing the flow rate of the HCl gas while keeping the flow rate of In raw material gas constant.

Figure 4A:
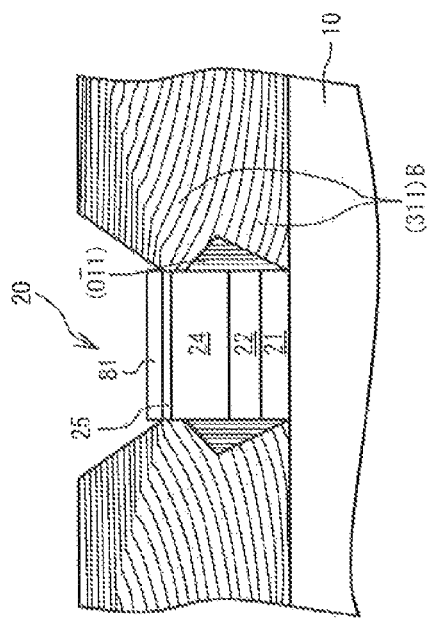
FIGS. 4A to 4D are cross-sectional views illustrating the growth behavior of test buried layers that are grown at different concentrations of HCl.

In the example illustrated in FIG. 4A, the test buried layer had a highest growth rate among four. The test buried layer in FIG. 4a showed abnormal growth protruding on the mesa 20. In the examples illustrated in FIGS. 4B to 4D, the test buried layers were not grown over the mesa 20. As illustrated in FIGS. 4A to 4D, the size of the first region (0-11) in the test buried layer decreases as increasing the HCl concentration. The upper portions of the contact layers 25 in contact with the masks 81 are not etched in FIGS. 4B to 4D despite the existence of the HCl gas.

Figure 4B:
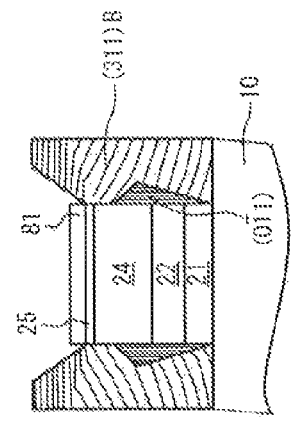
Figure 4C:
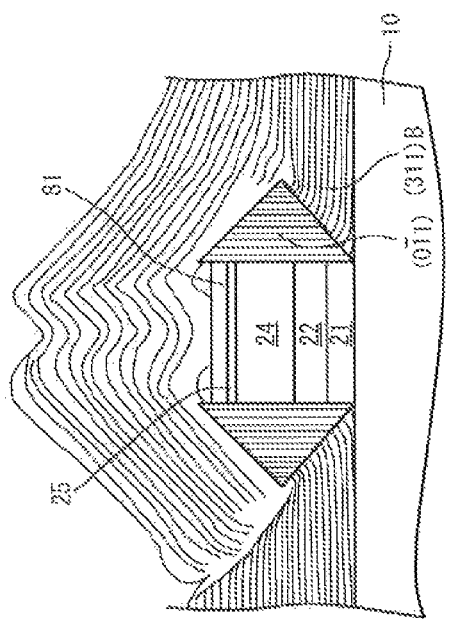
Figure 4D:
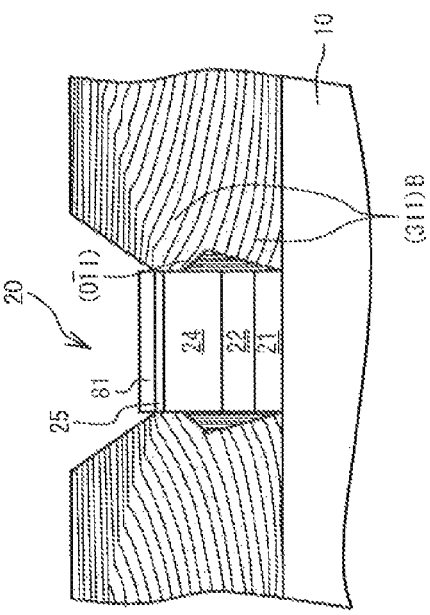
Figure 5:
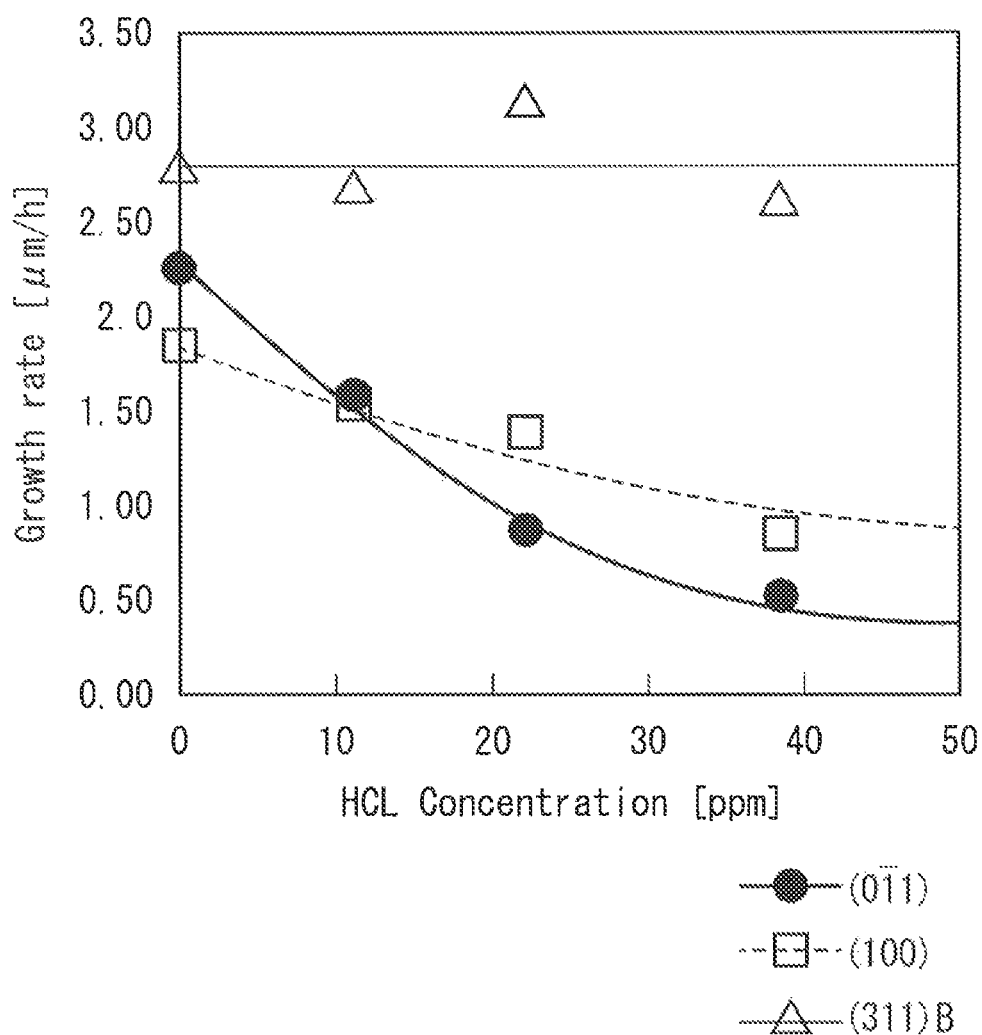
FIG. 5 is a graph showing the relationship between the concentration of HCl of a growing reactor and the growth rate of a buried layer.

FIG. 5 is a graph showing the growth rate of the first and second regions of test buried layer. The growth rate is determined from the intervals of the marker layers in FIGS. 4A to 4D. FIG. 5 shows that the growth rate of the first region (0-11) decreases with increasing concentration of HCl in the atmosphere. On the other hand, the growth rate of the second region (311)B is substantially independent of the concentration of HCl. In the presence of 11 ppm HCl, the growth rate of the first region (0-11) is approximately 0.6 times the growth rate of the second region (311)B.

The growth rate of the first region (0-11) can be made smaller than the growth rate of the second region (311)B by adding the HCl in the atmosphere. As the flow rate of Cp$_2$Fe is kept constant during the growth of the first and second regions, the first region is considered to contact with substantially increased Cp$_2$Fe flow. This increased Cp$_2$Fe flow can be quantified using "a converted Cp$_2$Fe flow rate Qn (sccm)" defined by the following equation;

$$Qn = \frac{2.0}{v} \times Q \quad (1)$$

where the Q denotes the actual Cp$_2$Fe flow rate (=10 sccm), v is a growth rate of each region. In the equation (1), the converted flow rate denotes the flow rate of Cp$_2$Fe if the growth rate be assumed as 2.0 µm/h.

Table I and Table II list the growth rates v measured from the FIG. 4A to 4D and the converted Cp$_2$Fe flow rates Qn for the first region (0-11) and the second region (311)B.

TABLE I

Growth rates and converted Cp$_2$Fe flow rates in the first region (0-11)

| HCl concentration (ppm) | growth rate v (µm/h) | converted Cp$_2$Fe flow rate Qn (sccm) | corresponding figure |
|---|---|---|---|
| 0 | 2.27 | 8.82 | FIG. 4A |
| 11 | 1.56 | 12.84 | FIG. 4B |
| 22 | 0.87 | 23.08 | FIG. 4C |
| 38.4 | 0.52 | 38.46 | FIG. 4D |

TABLE II

Growth rates and converted Cp$_2$Fe flow rates in the first region (311)B

| HCl concentration (ppm) | growth rate v (µm/h) | converted Cp$_2$Fe flow rate Qn (sccm) | corresponding figure |
|---|---|---|---|
| 0 | 2.80 | 7.14 | FIG. 4A |
| 11 | 2.68 | 7.46 | FIG. 4B |
| 22 | 3.14 | 6.37 | FIG. 4C |
| 38.4 | 2.60 | 7.69 | FIG. 4D |

Figure 6:
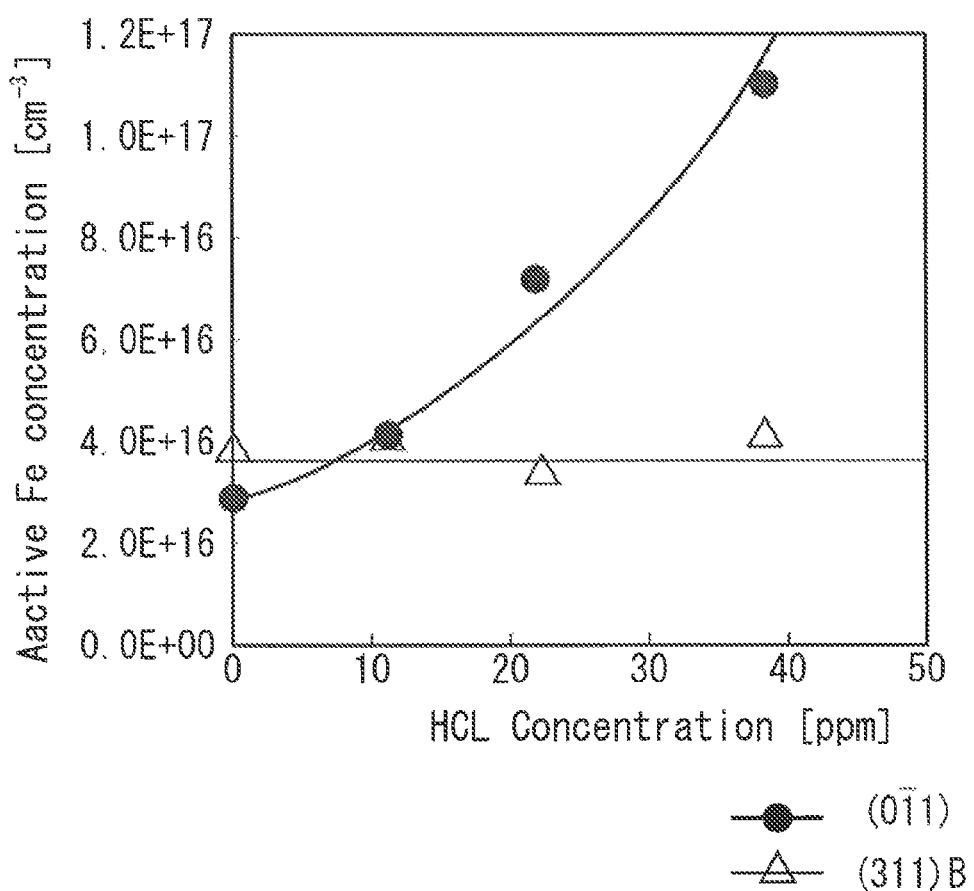
FIG. 6 is a graph showing the relationship between the concentration of HCl in the atmosphere of a growing reactor and the active Fe concentration.

FIG. 6 is a graph showing the relationship between the concentration of HCl and the active Fe concentration. The active Fe concentration is estimated using the FIG. 3, by adapting the converted Cp$_2$Fe flow rate Qn to the horizontal axis of FIG. 3. As illustrated in FIG. 6, when the concentration of HCl is more than 11 ppm, the first region (0-11) can have a higher active Fe concentration than the second region (311)B.

Table III lists the threshold current and threshold current density of a semiconductor laser device 100. The semiconductor device 100 is a QCL having a cavity length L of 3 mm and an active layer width of 10 µm. The semiconductor laser devices shown in Table III include the buried layers formed at a HCl concentration of 11 ppm or 38.4 ppm. Both lasers show a low threshold current and a low threshold current density. Thus, the buried layers in the semiconductor lasers are regarded to retain good crystallinity, and high withstand voltage characteristics.

TABLE III

Characteristics of semiconductor laser device (QCL) with the buried layer formed at different HCl concentrations.

| HCl concentration (ppm) | Threshold current (mA) | Threshold current density (kA/cm$^2$) |
|---|---|---|
| 11.0 | 450 | 1.50 |
| 38.4 | 320 | 1.07 |

The other conditions such as temperature for epitaxial growth of the buried layer will be discussed below. HCl in the atmosphere may etch the the mesa 20. Table IV shows whether the active layer 22 and the contact layer 25 were etched after the buried layer 30 was grown at different temperatures and at different concentrations of HCl. In Table IV, "Width before the growth" is a measured width of the mask 81 used to form the mesa 20, and it is substantially equal to the width of the mesa 20 before the growth of the buried layer 30. "Residual width" is the measured width of the active layer 22 and the contact layer 25 after the growth of the buried layer 30 measured by SEM observation of a cross section.

Table IV shows that the HCl concentration does not significantly affect the residual width of the active layer 22 and the contact layer 25 at a pressure of 10000 Pa (100 mbar) and at a growth temperature of 575° C. Thus, HCl in the atmosphere negligibly etches the active layer 22 and the contact layer 25. The residual widths of the active layer 22 and the contact layer 25 were not significantly changed even at increased growth temperatures of 600° C. and 620° C.

TABLE IV

| Width of the waveguide mesa after the growth of the burying layer | | | | |
|---|---|---|---|---|
| Growth temperature (° C.) | HCl concentration (ppm) | Width before the growth (μm) | Residual width (μm) | |
| | | | Contact layer | Active layer |
| 575 | 0 | 6.63 | 6.21 | 6.77 |
| 575 | 11 | 6.65 | 6.22 | 6.85 |
| 575 | 22 | 6.61 | 5.91 | 6.65 |
| 575 | 38.4 | 6.61 | 6.21 | 6.61 |
| 600 | 22 | 6.60 | 6.20 | 6.65 |
| 620 | 22 | 6.53 | 6.13 | 6.71 |

Thus, the growth temperature of the buried layer 30 is preferably less than 620° C. This can reduce etching of the active layer 22 and the contact layer 25 with HCl. In order to further reduce etching of the active layer 22 and the contact layer 25, the growth temperature of the buried layer 30 preferably ranges from 550° C. to 600° C. The pressure of the atmosphere is preferably 10000 Pa (100 mbar) or more.

For example, in the step of growing the buried layer 30 illustrated in FIG. 2E, the semiconductor substrate 10 is placed in a reactor, and the buried layer 30 is epitaxially grown in an atmosphere containing HCl at a growth temperature: 575° C., a reactor pressure: 10000 Pa (100 mbar), a growth rate: 2 μm/h, a concentration of HCl in the atmosphere: 11 ppm, and a $Cp_2Fe$ flow rate: 10 sccm. HCl is supplied from the beginning of the epitaxial growth. The HCl concentration is constant during the epitaxial growth. The semiconductor substrate 10 is then cooled to room temperature in a $PH_3$ atmosphere and is removed from the reactor.

In the method for manufacturing a semiconductor device according to the present embodiment, HCl in the atmosphere decreases the growth rate of the first region (0-11) on the side surfaces of the active layer 22 while keeping the growth rate of the second region (311)B substantially constant. Thus, the first region (0-11) can have a higher active Fe concentration than the second region (311)B.

What is claimed is:

1. A method for manufacturing a semiconductor device comprising the steps of:
    growing a stacked semiconductor layer on a principal surface of a substrate, the stacked semiconductor layer including an active layer and a cladding layer;
    forming a mesa structure by etching the stacked semiconductor layer using a dry etching method, the mesa structure extending in a [011] direction; and
    forming a buried layer on a side surface of the mesa structure and the principal surface of the substrate in a reactor of an organo-metallic vapor phase epitaxy apparatus while supplying a hydrogen chloride gas into the reactor, the buried layer being composed of an Fe-doped InP,
    wherein, in the step of forming the buried layer, the hydrogen chloride gas is supplied from the beginning of forming the buried layer,
    the buried layer has a first region and a second region,
    the first region is formed on a side surface of the active layer, the first region having a front surface of a (311)B plane,
    the second region is formed on the from surface of the first region, and
    the first region has a higher Fe concentration than that of the second region.

2. The method for manufacturing a semiconductor device according to claim 1, wherein the buried layer is formed at a temperature of lower than 620° C.

3. The method for manufacturing a semiconductor device according to claim 1, wherein the buried layer is formed at a temperature between 550° C. and 600° C.

4. The method for manufacturing a semiconductor device according to claim 1, wherein the hydrogen chloride gas is supplied at a concentration more than 11 ppm.

5. The method for manufacturing a semiconductor device according to claim 1, further comprising the steps of:
    growing a test buried layer on a mesa structure by changing, as a growth condition, a flow rate of the hydrogen chloride gas;
    observing a growth rate of the test buried layer in a direction perpendicular to a side surface of the mesa structure on which the test buried layer is grown; and
    obtaining a correlation between the growth rate and the flow rate of the hydrogen chloride gas, wherein
    the steps of forming the test buried layer and observing the growth rate of the test buried layer are performed in advance of the step of forming the buried layer, and
    the buried layer is grown under a condition determined based on the correlation between the growth rate and the flow rate of the hydrogen chloride gas.

* * * * *